(12) United States Patent
Park

(10) Patent No.: US 6,576,949 B1
(45) Date of Patent: Jun. 10, 2003

(54) INTEGRATED CIRCUIT HAVING OPTIMIZED GATE COUPLING CAPACITANCE

(75) Inventor: Stephen Keetai Park, Cupertino, CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

(21) Appl. No.: 09/387,710

(22) Filed: Aug. 30, 1999

(51) Int. Cl.[7] .............................................. H01L 21/02
(52) U.S. Cl. ...................... 257/314; 257/316; 257/317; 257/321; 257/322
(58) Field of Search ................................ 257/314, 316, 257/317, 321, 322

(56) References Cited

U.S. PATENT DOCUMENTS

| | | | |
|---|---|---|---|
| 5,053,839 A | 10/1991 | Esquivel et al. ............ | 357/23.5 |
| 5,338,953 A | * 8/1994 | Wake ........................... | 257/314 |
| 5,589,412 A | 12/1996 | Iranmanesh et al. .......... | 437/43 |
| 5,753,525 A | 5/1998 | Hsu et al. ..................... | 437/43 |
| 5,753,951 A | * 5/1998 | Geissler ....................... | 257/314 |
| 5,859,459 A | 1/1999 | Ikeda ........................... | 257/374 |
| 5,885,883 A | 3/1999 | Park et al. ................... | 438/435 |
| 6,146,970 A | 11/2000 | Witek et al. ................. | 438/424 |
| 6,258,669 B1 | 7/2001 | Park ............................ | 438/264 |

FOREIGN PATENT DOCUMENTS

| | | |
|---|---|---|
| EP | 0351316 | 1/1990 |
| EP | 0841693 A1 | 5/1998 |
| JP | 04208572 | 7/1992 |
| JP | 8-88285 | 4/1996 |
| JP | 08097306 | 12/1996 |
| JP | 09213783 | 8/1997 |
| WO | WO 96/08840 | 3/1996 |
| WO | WO 99/31730 | 6/1999 |

* cited by examiner

*Primary Examiner*—Edward Wojciechowicz
(74) *Attorney, Agent, or Firm*—Foley & Lardner

(57) ABSTRACT

The present invention is directed to an integrated circuit having an optimized gate coupling capacitance. The integrated circuit includes a substrate defining a trench therein. A first conductive layer has a portion which extends into the trench. The first conductive layer defines a channel fabricated by a blanket etching step. An insulative layer is adjacent the first conductive layer. A second conductive layer is adjacent the insulative layer. The present invention is further directed to a method of fabricating an integrated circuit. The method includes forming a trench in the substrate, filling the trench with a trench fill material, etching the trench fill material until an upper surface of the trench fill material is below an upper surface of the substrate, providing a first conductive layer over at least a portion of the trench fill material, and blanket etching the first conductive layer until the portion is exposed.

20 Claims, 7 Drawing Sheets

US 6,576,949 B1

INTEGRATED CIRCUIT HAVING OPTIMIZED GATE COUPLING CAPACITANCE

CROSS-REFERENCE TO RELATED APPLICATIONS

The present application is related to the following commonly assigned applications: U.S. patent application Ser. No. 09/385,534 entitled "Integrated Circuit Having Improved Gate Coupling Capacitance" and filed Aug. 30, 1999 by Park, U.S. patent application Ser. No. 09/504,087 entitled "Integrated Circuit Having Increased Gate Coupling Capacitance" and filed Feb. 15, 2000 by Park et al., U.S. patent application Ser. No. 09/385,164 entitled "Integrated Circuit Having Resistance To Silicide Crack" and filed Aug. 30, 1999 by Park, and U.S. patent application Ser. No. 09/543,991 entitled "High Coupling Flash Cell" and filed Apr. 6, 2000 by Wang et al.

FIELD OF THE INVENTION

The present invention relates generally to an integrated circuit having optimized gate coupling capacitance. The present invention further relates to an integrated circuit having a polysilicon layer optimized for gate coupling capacitance.

BACKGROUND OF THE INVENTION

The present invention applies particularly to the fabrication of nonvolatile memory integrated circuits (e.g., flash, EPROM, EEPROM, etc.), but may find applications in other integrated circuits. Nonvolatile memory integrated circuits are used in a wide variety of commercial and military electronic devices, including hand held telephones, radios and digital cameras. The market for these electronic devices continues to demand lower voltage, lower power consumption and decreased chip size. Also, the demand for greater functionality is driving the design rule lower, from the 0.35–0.25 micron technology of today to 0.18 micron, 0.15 micron and lower.

A conventional flash memory cell of a flash memory IC is illustrated in FIGS. 1 and 2. FIG. 1 depicts a cross-sectional view along the bit line direction of a single flash memory cell 10 on a substrate 11. Cell 10 includes a first transistor 12 and a second transistor 14. Each of transistors 12, 14 includes a tunnel oxide layer 16, a first polysilicon layer 18, 20, an interpoly dielectric layer 22, 24, a second polysilicon layer 26, 28, a silicide layer 30, 32 and sidewall spacers 34, 36.

With reference first to FIGS. 2–7, a conventional flash memory cell fabrication process is illustrated. A substrate 11 is shown in FIGS. 2–7 in a cross-sectional view along the word line direction. Substrate 11 includes a shallow trench isolation structure (STI) 40 between devices (not shown), such as, metal-oxide-semiconductor field effect transistors (MOSFETs), memory cells, or other devices. STI 40 includes an oxide fill material 42. A tunnel oxide layer 16 is provided above substrate 11. First and second polysilicon wings 46, 48 are patterned in first polysilicon layer 20. Interpoly dielectric layer 24 is provided above polysilicon wings 46, 48 and also above STI 40. Second polysilicon layer 28 and silicide layer 32 are provided above interpoly dielectric layer 24.

Referring now to FIG. 3, STI 40 is formed by first applying a pad oxide layer 50 over substrate 11 and subsequently growing or depositing a nitride layer 52. A STI mask and etch step forms STI recess 54. Referring now to FIG. 4, an STI liner oxide 56 is provided to line recess 54 followed by a trench fill with a PECVD oxide fill material 58 (Plasma Enhanced Chemical Vapor Deposition). As shown in FIG. 5, a planarization step and a trench CMP (Chemical Mechanical Polishing) step are applied to PECVD oxide fill material 58 to remove the oxide above nitride layer 52 and partially along sides 60, 62 of nitride layer 52.

Referring now to FIG. 6, a nitride strip step removes nitride layer 52. Pad oxide layer 50 is removed by sacrificial oxidation. Subsequently, a tunnel oxide layer 62 is grown above substrate 11. Referring now to FIG. 7, a first polysilicon layer 20 is applied. Layer 20 is patterned (i.e., masked and etched) to form wings 46, 48. Referring again to FIG. 2, interpoly dielectric layer 24 (e.g., Oxide Nitride Oxide) is grown over wings 46, 48. Second polysilicon layer 28 is then deposited, followed by deposition of silicide layer 32.

In operation, a data element is stored on polysilicon layers 18, 20 (FIG. 1), also called the floating gate. Access to the data element is obtained via second polysilicon layers 26, 28, also called the control gate or wordline. While the voltage of the data element is typically on the order of 3.3 Volts, the voltage that must be applied to the control gate to access this data element is on the order of 9 Volts. Thus, a charge pump (not shown) is located on the flash memory IC to raise the chip voltage from 3.3 Volts to a target voltage of 9 Volts.

Charge pumps are large, taking up substantial space on the flash memory cell and further compromising the reliability of the IC. As design rules continue to decrease, the size of the charge pump becomes an obstacle in chip design. However, the size of the charge pump can be decreased by decreasing the target voltage. The target voltage can be decreased by increasing the gate coupling ratio ($\alpha$) of the memory cell. Gate coupling ratio ($\alpha$) is defined as:

$$\alpha = C_{ono}/(C_{ono} + C_{tox})$$

where $C_{ono}$ is the capacitance between first polysilicon layer 18, 20 and second polysilicon layer 26, 28 and $C_{tox}$ is the capacitance between substrate 11 and first polysilicon layer 26, 28.

Accordingly, what is needed is an IC and method of fabricating an IC to increase the gate coupling ratio, decreasing the target voltage of the charge pump, thereby decreasing power consumption of the IC, decreasing the size of the charge pump, and improving reliability.

SUMMARY OF THE INVENTION

These and other limitations of the prior art are addressed by the present invention which is directed to an integrated circuit having an optimized gate coupling capacitance. The integrated circuit includes a substrate defining a trench. A first conductive layer has a portion which extends into the trench. The first conductive layer also defines a channel fabricated by a blanket etching step. The integrated circuit further includes an insulative layer adjacent the first conductive layer and a second conductive layer adjacent the insulative layer.

According to another embodiment of the present invention, a method of fabricating an integrated circuit on a substrate is provided. The method includes forming a trench in the substrate; filling the trench with a trench fill material; etching the trench fill material until an upper surface of the trench fill material is below an upper surface of the substrate; providing a first conductive layer over at least a portion of the trench; and blanket etching the first conductive layer until the portion is exposed.

According to yet another embodiment of the present invention, an integrated circuit having an optimized gate coupling capacitance is provided. The integrated circuit is fabricated by a process comprising the steps of: forming a trench in the substrate; filling the trench with a trench fill material; etching the trench fill material until the trench fill material is recessed within the trench; providing a first conductive layer over at least a portion of the trench fill material; and blanket etching the first conductive layer until the portion is exposed.

BRIEF DESCRIPTION OF THE DRAWINGS

The invention will become more fully understood from the following detailed description, taken in conjunction with the accompanying drawings, wherein like reference numerals refer to like parts, and in which.

DETAILED DESCRIPTION OF THE PREFERRED EMBODIMENTS

As stated hereinabove, an increase in the gate coupling ratio is required to decrease the target voltage of the charge pump to, in turn, decrease the size of the charge pump. The present invention achieves an increase in the gate coupling ratio by increasing the capacitance across the interpoly dielectric layer between first and second polysilicon layers (a.k.a., "poly 1" and "poly 2", respectively). As will be shown, this increase is obtained by increasing the surface area across which poly 1 and poly 2 are in contact, thereby increasing the surface area of the capacitor formed by poly 1, poly 2 and the interpoly dielectric layer.

Figure 8:
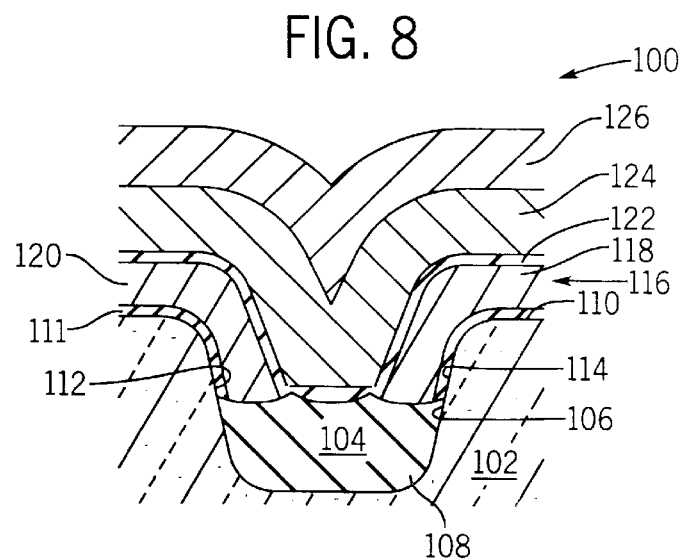
FIG. 8 depicts a portion of an integrated circuit according to an exemplary embodiment of the present invention.

With reference now to FIG. 8, a portion 100 of an integrated circuit (IC) having an improved gate coupling ratio according to one embodiment of the present invention is shown in cross-section along the word line direction. The IC is a flash memory device, but may alternatively be another nonvolatile memory (e.g., EPROM, EEPROM, etc.) or other integrated circuit. A semiconductor substrate 102 (e.g., silicon, germanium, gallium arsenide, etc.) includes an isolation structure 104 defined in a recess 106. In this embodiment, isolation structure 104 is a shallow trench isolation structure containing a trench fill material 108. Trench fill material 108 is an insulative material, such as, PECVD oxide. Trench fill material 108 extends from the bottom of recess 106 toward an upper surface 110 of substrate 102, but does not extend to upper surface 110. Recess 106 has a bottom surface 105 approximately 1000 to 7000 Angstroms (Å) below upper surface 110, and preferably about 4000 Å below upper surface 110.

A first insulative layer 111, such as, a tunnel oxide layer, is provided over upper surface 110 of substrate 102 and over side walls 112, 114 of recess 106. A first conductive layer 116, such as, doped polysilicon is provided over first insulative layer 111. First conductive layer 116 is blanket etched without masking to form a first conductive wing or portion 118 and a second conductive wing or portion 120. Blanket etching, as used herein, is defined as etching without masking. First and second conductive portions 118, 120 extend at least partially into recess 106 to increase the surface area that conductive layer 116 has exposed to the subsequent layers, relative to the prior art. This increase in surface area results in an increase in capacitance, which raises the gate coupling ratio as described hereinbefore. In this exemplary embodiment, an upper surface 134 of trench fill material 108 is at least 100 Å beneath upper surface 110 of substrate 102. Upper surface 134 may be as deep as 2000 to 10,000 Å beneath upper surface 110 of substrate 102, and is preferably approximately 1000 Å beneath upper surface 110 of substrate 102. Accordingly, conductive layer 116 extends into recess 106 until it reaches upper surface 134, preferably about half the depth of recess 106.

A second insulative layer 122, such as, an interlevel dielectric layer (e.g., Oxide Nitride Oxide) is provided over first conductive layer 116 and trench fill material 108. Insulative layer 122 forms an insulative barrier between conductive portions 118, 120. A second conductive layer 124, such as, doped polysilicon is provided over second insulative layer 122. Thus, insulative layer 122 also insulates layers 116 and 124 from one another. A silicide layer 126 is provided over second conductive layer 124.

Figure 9:
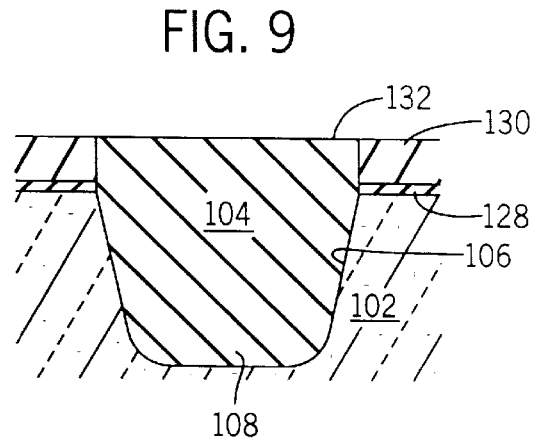
FIG. 9 depicts steps in the process of fabrication of the portion of an integrated circuit of FIG. 8.

Referring now to FIGS. 9–13, a method of fabricating portion 100 is described. In FIG. 9, isolation structure 104 is formed by providing an insulative layer 128 including an oxide material (e.g., a pad oxide material, such as, $SiO_2$) over substrate 102. Layer 128 is grown in a conventional thermal process, or applied by a chemical vapor deposition (CVD) or a physical vapor deposition (PVD) process. Subsequently, a barrier layer 130, preferably a silicon nitride layer, e.g., $Si_3N_4$, is applied over insulative layer 128. Using a standard photolithographic process, an aperture is formed in layers 128, 130 at the desired location. A conventional trench etching process, such as a dry or plasma etch, is then utilized to etch recess 106 in substrate 102. A liner oxidation step forms an insulative liner (not shown) along the walls of recess 106. Next, recess 106 is filled with insulative trench fill material 108 by, for example, a PECVD oxide step. Optionally, trench fill material 108 may be planarized to achieve an upper surface 132 substantially coplanar with barrier layer 130. In this embodiment, trench fill material 108 is so planarized.

Figure 1:
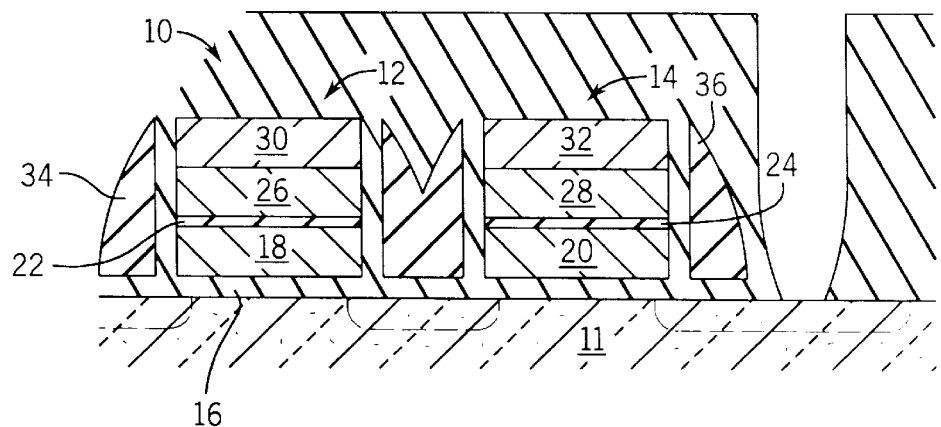
FIG. 1 depicts a cross-sectional view of a conventional flash memory cell along the bit line direction.
Figure 2:
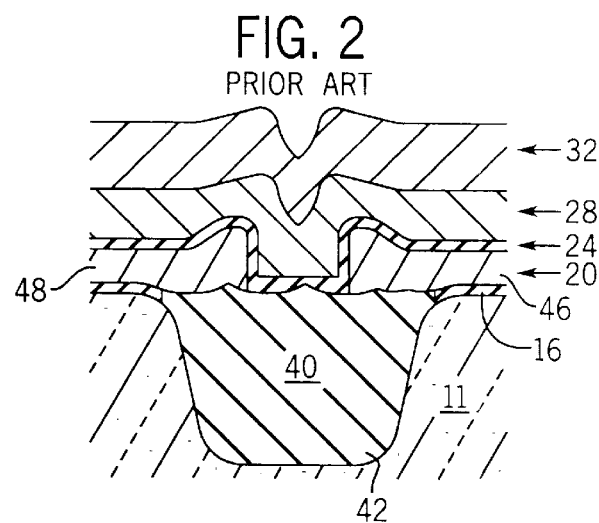
FIG. 2 depicts a cross-sectional view of the memory cell of FIG. 1 along the word line direction.
Figure 3:
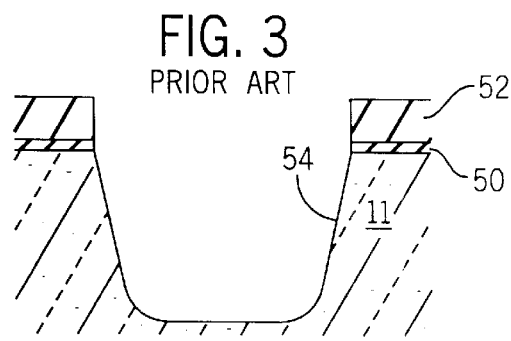
FIG. 3 depicts steps in the process of fabrication of the conventional flash memory cell of FIGS. 1 and 2.
Figure 4:
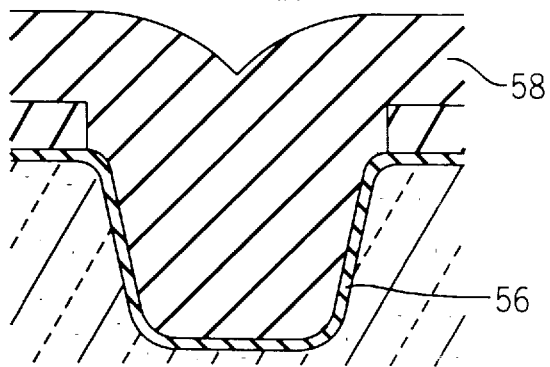
FIG. 4 depicts steps in the process of fabrication of the conventional flash memory cell of FIGS. 1 and 2.
Figure 5:
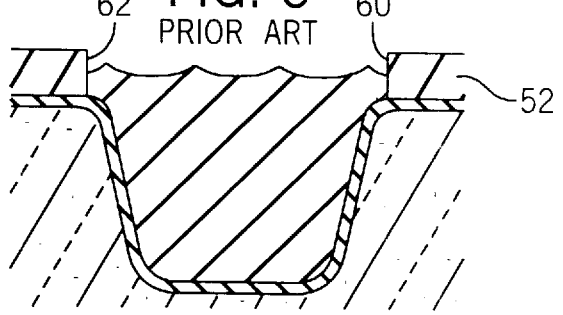
FIG. 5 depicts steps in the process of fabrication of the conventional flash memory cell of FIGS. 1 and 2.
Figure 6:
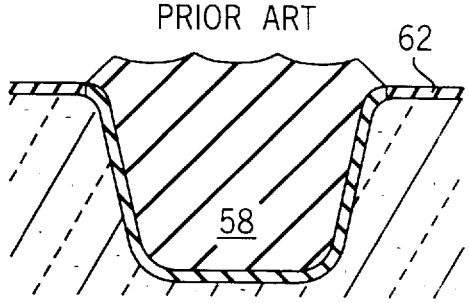
FIG. 6 depicts steps in the process of fabrication of the conventional flash memory cell of FIGS. 1 and 2.
Figure 7:
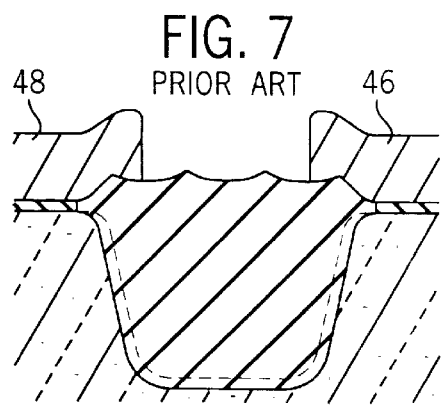
FIG. 7 depicts steps in the process of fabrication of the conventional flash memory cell of FIGS. 1 and 2.
Figure 10:
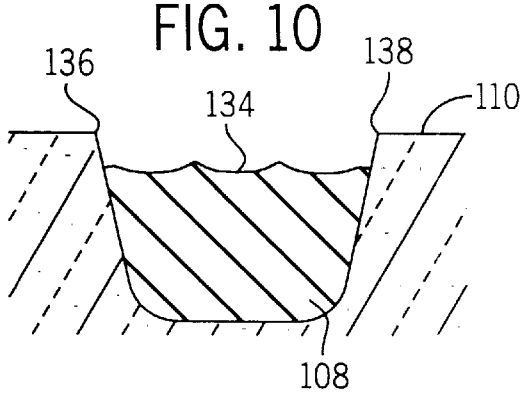
FIG. 10 depicts steps in the process of fabrication of the portion of an integrated circuit of FIG. 8.

Referring now to FIG. 10, both insulative layer 128 and barrier layer 130 are etched away from substrate 102, along with a portion of trench fill material 108. Trench fill material 108 is etched until upper surface 134 is recessed below upper surface 110 of substrate 102. Note that in the prior art (FIG. 6) only the nitride layer 52 is etched off by selective etching.

Figure 11:
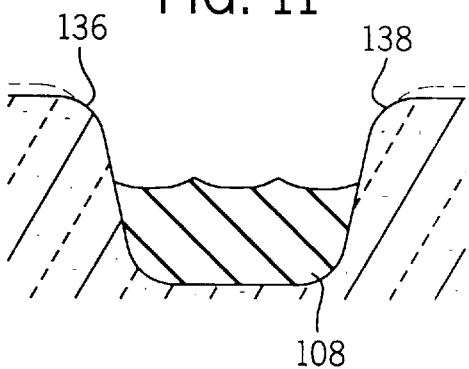
FIG. 11 depicts steps in the process of fabrication of the portion of an integrated circuit of FIG. 8.

In FIG. 11, a sacrificial oxidation and strip off step is performed to round corners 136, 138. In sacrificial oxidation, a thin oxide layer is grown and then stripped off to get the trench corner rounding. This rounding prevents the "double hump effect" in the I-V characteristic curve of the transistor. During this sacrificial oxidation, the level of trench fill material 108 may or may not be lowered further from the etching associated with FIG. 10.

Figure 12:
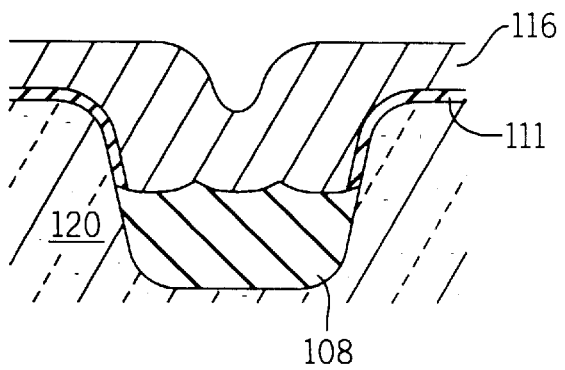
FIG. 12 depicts steps in the process of fabrication of the portion of an integrated circuit of FIG. 8.

In FIG. 12, first insulative layer 111 is thermally grown over substrate 120 or otherwise provided over substrate 120 using a known deposition process (e.g., chemical vapor deposition, physical vapor deposition). In this embodiment, first insulative layer 111 is a tunnel oxide layer ($SiO_2$). Next, first conductive layer 116 ("poly 1") is deposited over first insulative layer 111 and trench fill material 108. Poly 1 layer 116 is deposited with a thickness greater than 1000 Angstroms, preferably approximately 1600 to 2000 Angstroms, and perhaps as high as approximately 5000 Angstroms. Since poly 1 layer 116 will be blanket etched (as described below), poly 1 layer 116 must be deposited with a thickness greater than a desired end thickness. Note that poly 1 layer 116 extends down into recess 106.

Figure 13:
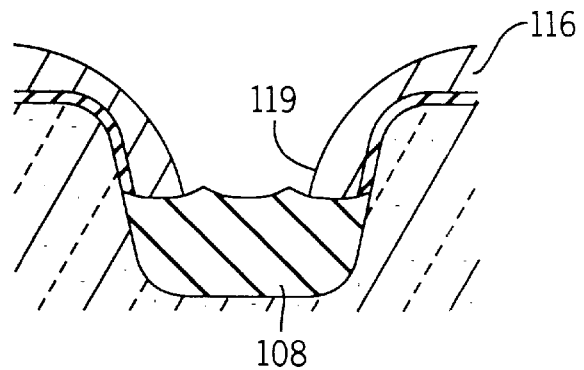
FIG. 13 depicts steps in the process of fabrication of the portion of an integrated circuit of FIG. 8.

In FIG. 13, poly 1 layer 116 is blanket etched until at least a portion of trench fill material 108 is exposed. Thus, a channel 119 is formed. Referring again to FIG. 8, second insulative layer 122 is then grown (e.g., ONO), followed by deposition of second conductive layer 124 (e.g., polysilicon), followed by deposition of silicide layer 126. Note that a portion of second insulative layer 122 and a portion of second conductive layer 124 extend into channel 119 in this embodiment.

Referring now to FIGS. 14–19, an alternative embodiment of the present invention is disclosed. As mentioned hereinbefore with reference to FIG. 9, trench fill material 108 may optionally be planarized to achieve an upper surface 132 substantially coplanar with barrier layer 130. In the embodiment of FIGS. 9–13, trench fill material 108 was so planarized. In the embodiment of FIGS. 14–19, trench fill material 208 is not so planarized.

Figure 14:
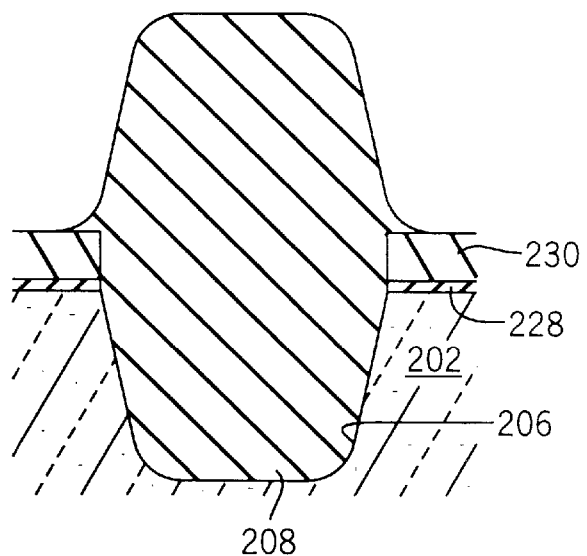
FIG. 14 depicts steps in the process of fabrication of a portion of an integrated circuit according to an alternative embodiment of the present invention.
Figure 15:
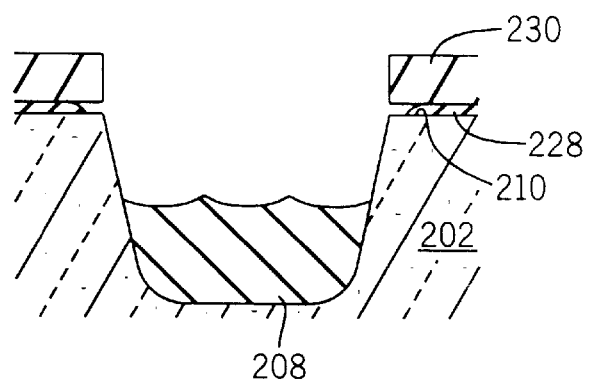
FIG. 15 depicts steps in the process of fabrication of the portion of an integrated circuit of FIG. 14.

Thus, following the trench fill step described hereinbefore with reference to FIG. 9, the substrate appears as shown in FIG. 14. FIG. 14 shows an insulative layer 228, a barrier layer 230, a recess 206 and a trench fill material 208. In this embodiment, trench fill material 208 is not planarized. FIG. 15 depicts a blanket etching step (e.g., dry etch, wet etch, etc.) of trench fill material 208. This blanket etching step etches trench fill material 208 into recess 206 and at least below an upper surface 210 of a substrate 202. Note that barrier layer 230 is not etched in this blanket etching step. This etching step can be contrasted with that of the first embodiment depicted in FIG. 10 wherein insulative layer 228 and barrier layer 230 are removed.

Figure 16:
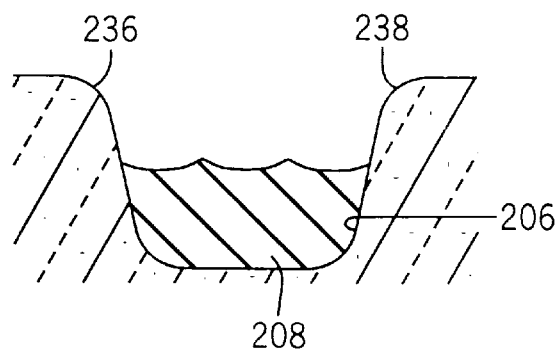
FIG. 16 depicts steps in the process of fabrication of the portion of an integrated circuit of FIG. 14.

Referring now to FIG. 16, insulative layer 228 and barrier layer 230 are stripped from substrate 202 using a nitride strip or other stripping step. Next, a sacrificial oxidation and strip off step is performed to round corners 236, 238 in a similar manner as corners 136, 138 in FIG. 11. Again, during this sacrificial oxidation, the level of trench fill material 208 may or may not be lowered further from the etching associated with FIG. 10.

Figure 17:
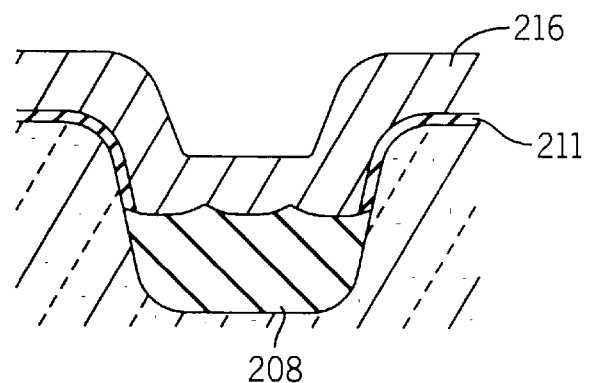
FIG. 17 depicts steps in the process of fabrication of the portion of an integrated circuit of FIG. 14.

Referring now to FIG. 17, a first insulative layer 211 is thermally grown over substrate 202 or otherwise provided over substrate 202 using a known deposition process (e.g., chemical vapor deposition, physical vapor deposition, etc.). In this embodiment, first insulative layer 211 is a tunnel oxide layer ($SiO_2$). Next, a first conductive layer 216 ("poly 1") is deposited over first insulative layer 211 and trench fill material 208. Poly 1 layer 116 is deposited with a thickness of approximately 1600 to 2000 Angstroms, which may be as high as approximately 5000 Angstroms or as low as approximately 1000 Angstroms. Note that poly 1 layer 216 extends down into recess 206.

Figure 18:
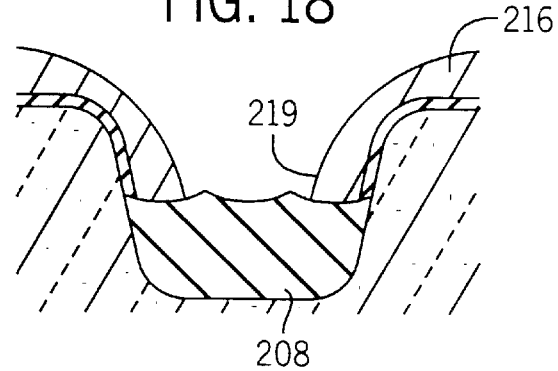
FIG. 18 depicts steps in the process of fabrication of the portion of an integrated circuit of FIG. 14.
Figure 19:
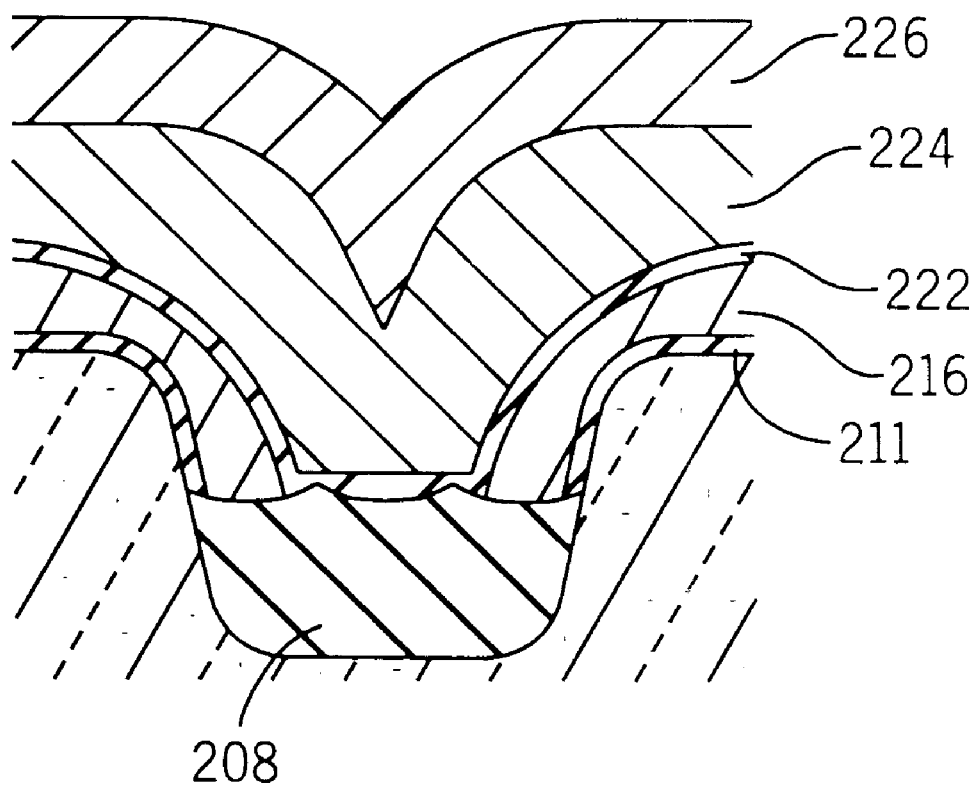
FIG. 19 depicts a portion of an integrated circuit according to the alternative embodiment of FIGS. 14–18.

Referring now to FIG. 18, poly 1 layer 216 is blanket etched until at least a portion of trench fill material 208 is exposed. Thus, a channel 219 is formed. In FIG. 19, a second insulative layer 222 is then grown (e.g., ONO), followed by deposition of a second conductive layer 224 (e.g., polysilicon), followed by deposition of a silicide layer 226.

One advantage of this second embodiment is that the etching steps of FIGS. 9 and 10 are eliminated and replaced by the single blanket etching step of FIG. 15, making the process flow simpler. One advantage of the first embodiment is that the etching of trench fill material in FIG. 10 is for a shorter duration than the blanket etching of FIG. 15 of the second embodiment.

While the embodiments illustrated in the FIGS. and described above are presently preferred, it should be understood that these embodiments are offered by way of example only. For example, the specific materials or dimensions utilized in the preferred embodiments disclosed herein are provided as examples and are not meant to preclude the substitution of like materials or dimensions. Also, while the embodiments disclosed are particularly suitable for a flash EPROM or other nonvolatile memory, they may find application in non-memory devices. The invention is not limited to a particular embodiment, but extends to various modifications that nevertheless fall within the scope of the appended claims.

What is claimed is:

1. An isolation structure for isolating devices on an integrated circuit, comprising:
    a substrate having an upper surface and a trench;
    a first conductive layer over the upper surface and having a portion of the first conductive layer extending into the trench, wherein the first conductive layer forms opposing sides of a channel within the trench, and wherein a portion of the channel is fabricated by blanket etching through the first conductive layer, wherein the portion of the first conductive layer has a first side, a second side, and a terminating end, the first side being substantially parallel with a second side, the terminating end being substantially perpendicular to the first side;
    an insulative layer above the first conductive layer; and
    a second conductive layer adjacent the insulative layer.

2. The isolation structure of claim 1, wherein the insulative layer includes a portion extending into the trench.

3. The isolation structure of claim 2, wherein the second conductive layer includes a portion extending into the trench.

4. The isolation structure of claim 1, wherein the trench is filled with a trench fill material, wherein the trench and trench fill material comprise a shallow trench isolation structure.

5. The isolation structure of claim 1, wherein the portion extends into the trench approximately one half the depth of the trench.

6. The isolation structure of claim 1, wherein the substrate defines a corner where an upper surface of the substrate contacts the trench, wherein the corner is rounded.

7. The isolation structure of claim 1, wherein the first conductive layer, insulative layer and second conductive layer form part of a flash EPROM transistor.

8. The isolation structure of claim 1, wherein the trench fill material is an oxide material.

9. An isolation structure for an integrated circuit, the isolation structure fabricated by a process comprising:

forming a trench in the substrate;

filling the trench with a trench fill material;

etching the trench fill material until the trench fill material is recessed within the trench;

providing a first conductive layer over a portion of the trench fill material; and blanket etching the first conductive layer until the portion is exposed, wherein a first portion of the first conductive layer remains on an upper surface of the substrate, wherein a second portion of the first conductive layer extends into the trench, the second portion having a substantially rectangular cross sectional area with an end adjacent the trench fill material.

10. The isolation structure of claim 9, the process further comprising:

providing an insulative layer over the conductive layer; and providing a second conductive layer over the insulative layer.

11. The isolation structure of claim 10, wherein a portion of the insulative layer and a portion of the second conductive layer extend into the trench.

12. The isolation structure of claim 9, further comprising planarizing the trench fill material after the step of filling the trench with a trench fill material.

13. The isolation structure of claim 9, wherein the step of etching includes blanket etching.

14. The isolation structure of claim 9, wherein the first conductive layer is provided with a thickness of greater than 1000 Angstroms.

15. An isolation structure for isolating devices on an integrated circuit, the isolation structure comprising:

a substrate having an upper surface and a trench;

a first conductive layer over the upper surface and having a portion extending into the trench, wherein the first conductive layer forms opposing sides of a channel within the trench, and wherein a portion of the channel is fabricated by blanket etching through the first conductive layer, the trench having rounded corners at the upper surface of the substrate, the first conductive layer including a top surface and a bottom surface terminating at an end, the end being substantially parallel with a bottom of the trench;

an insulative layer above the first conductive layer; and a second conductive layer adjacent the insulative layer.

16. The isolation structure of claim 15, wherein the insulative layer includes a portion extending into the trench.

17. The isolation structure of claim 16, wherein the second conductive layer includes a portion extending into the trench.

18. The isolation structure of claim 15, wherein the trench is filled with a trench fill material, wherein the trench and trench fill material comprise a shallow trench isolation structure.

19. The isolation structure of claim 15, wherein the portion extends into the trench approximately one half the depth of the trench.

20. The isolation structure of claim 15, wherein the substrate defines a corner where an upper surface of the substrate contacts the trench, wherein the corner is rounded.

* * * * *